United States Patent [19]

DuVall

[11] 4,037,225
[45] July 19, 1977

[54] KEYBOARD ENCODING SYSTEM WITH ELECTRONIC HYSTERESIS

[75] Inventor: Wilbur E. DuVall, Victorville, Calif.

[73] Assignee: Xerox Corporation, Stamford, Conn.

[21] Appl. No.: 634,976

[22] Filed: Nov. 25, 1975

[51] Int. Cl.² ............................................. G08C 1/00
[52] U.S. Cl. .............................. 340/365 E; 340/365 C
[58] Field of Search ...................................... 340/365 E

[56] References Cited

U.S. PATENT DOCUMENTS

| | | | |
|---|---|---|---|
| 3,716,850 | 2/1973 | Fisher | 340/365 E |
| 3,786,497 | 1/1974 | Davis | 340/365 E |
| 3,918,051 | 11/1975 | Bernin | 340/365 E |

Primary Examiner—Thomas B. Habecker

Attorney, Agent, or Firm—M. J. Colitz, Jr.; T. J. Anderson; L. Zalman

[57] ABSTRACT

A keyboard encoding system which utilizes electronic hysteresis to prevent undesired key stroke encoding. The output of a capacitive switch matrix is supplied to a sense amplifier which has its sensitivity increased if a particular switch of the switch matrix was closed the last scan cycle. The status of the switches of the switch matrix during the last scan cycle is provided by a shift register having a number of stages equal to the number of switches of the matrix. The sense amplifier includes a comparator which receives an input indicative of the state of a particular matrix switch during the present scan cycle and an input from the shift register indicative of the status of the particular matrix switch the previous scan cycle. If the input from the shift register is high, the sensitivity of the sense amplifier is increased.

1 Claim, 4 Drawing Figures

KEYBOARD ENCODING SYSTEM WITH ELECTRONIC HYSTERESIS

BACKGROUND OF THE INVENTION

Keyboard data entry devices for electronic data processing systems and word processing systems, and the like, are designed such that key closures are detected for a specific key actuator displacement. It often occurs that the keyboard operator depresses a key with a force that moves the key very close to the specified distance needed for closer detection. Due to fluctuations in the force applied by the key operator, the specified distance may be provided during the first scan cycle, may not be provided during a second scan cycle, and may once again be provided during a third scan cycle. In this case, a key closure is encoded during the first and third scan cycles when it is desired that only one key closure be encoded. The use of mechanical hysteresis to prevent the undesirable multiple encoding problem has not been totally successful.

There are instances where it is desirable to provide multiple encoding for one key closure such as a repeat key function, for example, an underlining function. To ensure that the repeat function is actually intended, it is desirable to have a delay built into the encoding system such that the repeat key must be depressed a minimum time before multiple encoding is initiated. The prior art has not produced a satisfactory repeat key encoding system.

OBJECTS OF THE INVENTION

An object of the present invention is to provide an improved keyboard encoding system.

A further object of the present invention is to provide a keyboard encoding system having electronic key hysteresis.

A further object of the present invention is to provide a keyboard encoding system utilizing a minimum of integrated circuit components.

SUMMARY OF THE INVENTION.

The encoding system of the present invention relates to a capacitive matrix having a plurality of crossover or switch points which are scanned cyclically to determine any change in capacitance at any crossover point due to the relative movement of the capacitor plates at that crossover point pursuant to a key closure. The change in capacitance is encoded in accordance with the invention by an encoding system which utilizes only one sense amplifier which has a first of its inputs coupled to one of the sense lines of the matrix and which has its sensitivity level changed by the status of the crossover point during the previous scan cycle. If the capacitance at a crossover point was high during the previous scan cycle (indicating a closure of the key corresponding to that crossover during the previous scan cycle), the sensitivity of the sense amplifier is increased when that crossover point is sensed during the next scan cycle. Changing the sensitivity of the sense amplifier is the equivalent of mechanical hysteresis of the key and is achieved by supplying to a second input of the sense amplifier a feedback signal from a shift register which is clocked at the scan rate, connected to receive the output of the sense amplifier, and has a number of stages equal to the number of crossover points of the matrix such that the status of any crossover point during the previous scan cycle is available for the input to the sense amplifier during the present scan cycle of that crossover point.

The encoding system permits one output of data per key stroke except when a repeat key, such as an underline key, is depressed. If the closed key is a repeat key, it is desirable to have a pause in the system to determine whether a repeat function is actually intended. This pause is achieved by means of a counter and two switching devices, with the counter incrementing once each scan cycle as long as the repeat key is closed and no other key that produces a strobe, i.e. closure pulse, is closed. The counter has the output of one of its stages coupled to a first of the switching devices and the counter has another, lower order, stage coupled to the second of the switching device. The second switching device is set or primed by the first switching device only after the first switching device is rendered conductive by the counter advancing or incrementing to the one stage. When the counter once again increments to the lower order stage, the second switching device conducts to produce a repeat key closure pulse only after the delay or pause caused by the need for the counter to increment twice to the lower order stage. The pause is of sufficient duration to ensure that the operator intended that a repeat function be carried out. Closing of another key producing a strobe will interrupt the cycle of the counter to stop the repeat key function, however, the repeat cycle will automatically be reinitiated if the repeat key remains closed.

DETAILED DESCRIPTION OF THE INVENTION

Figure 1A:
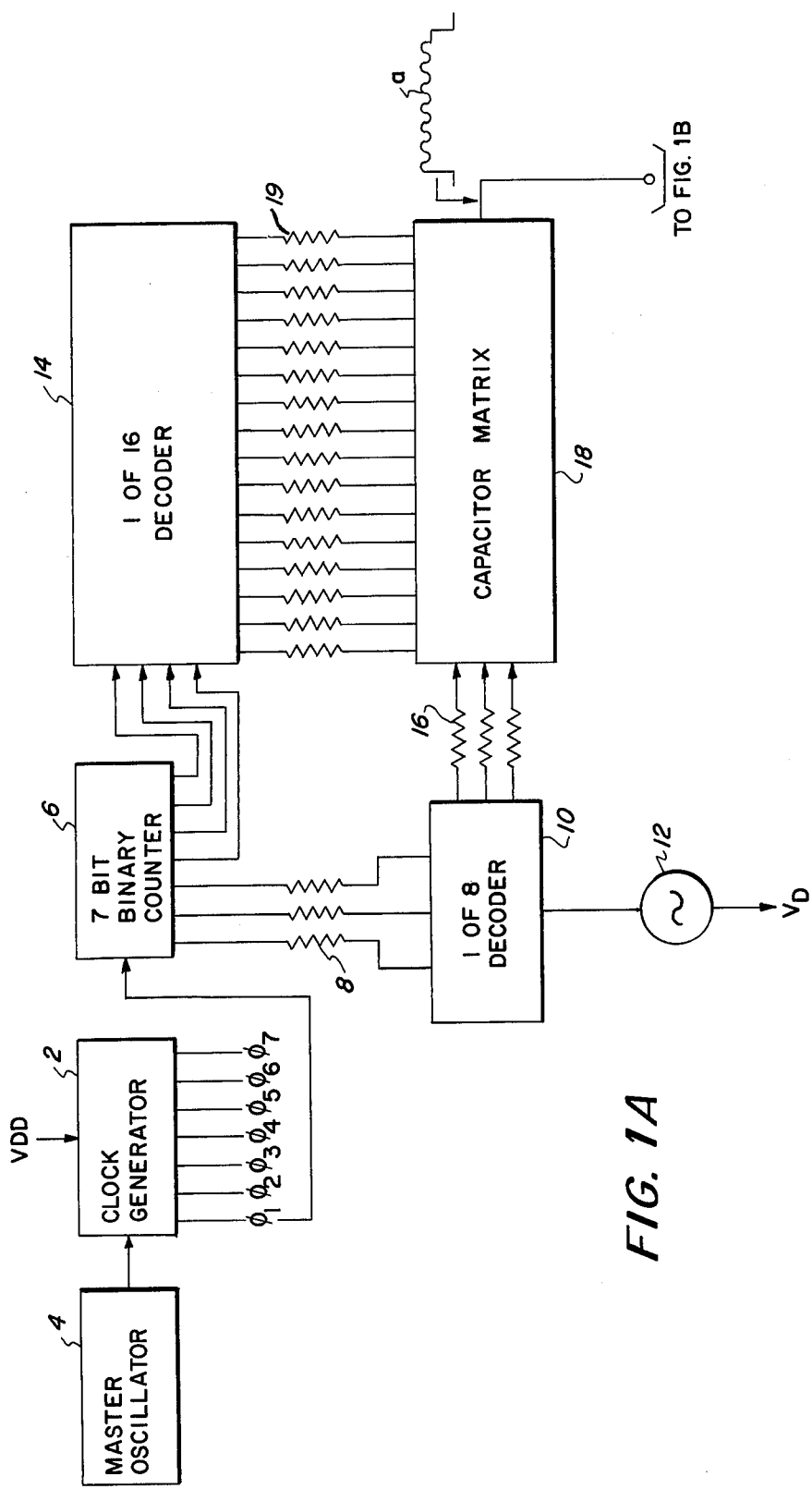
FIGS. 1a, 1b is a block diagram of the key encoding system of the present invention.
Figure 1B:
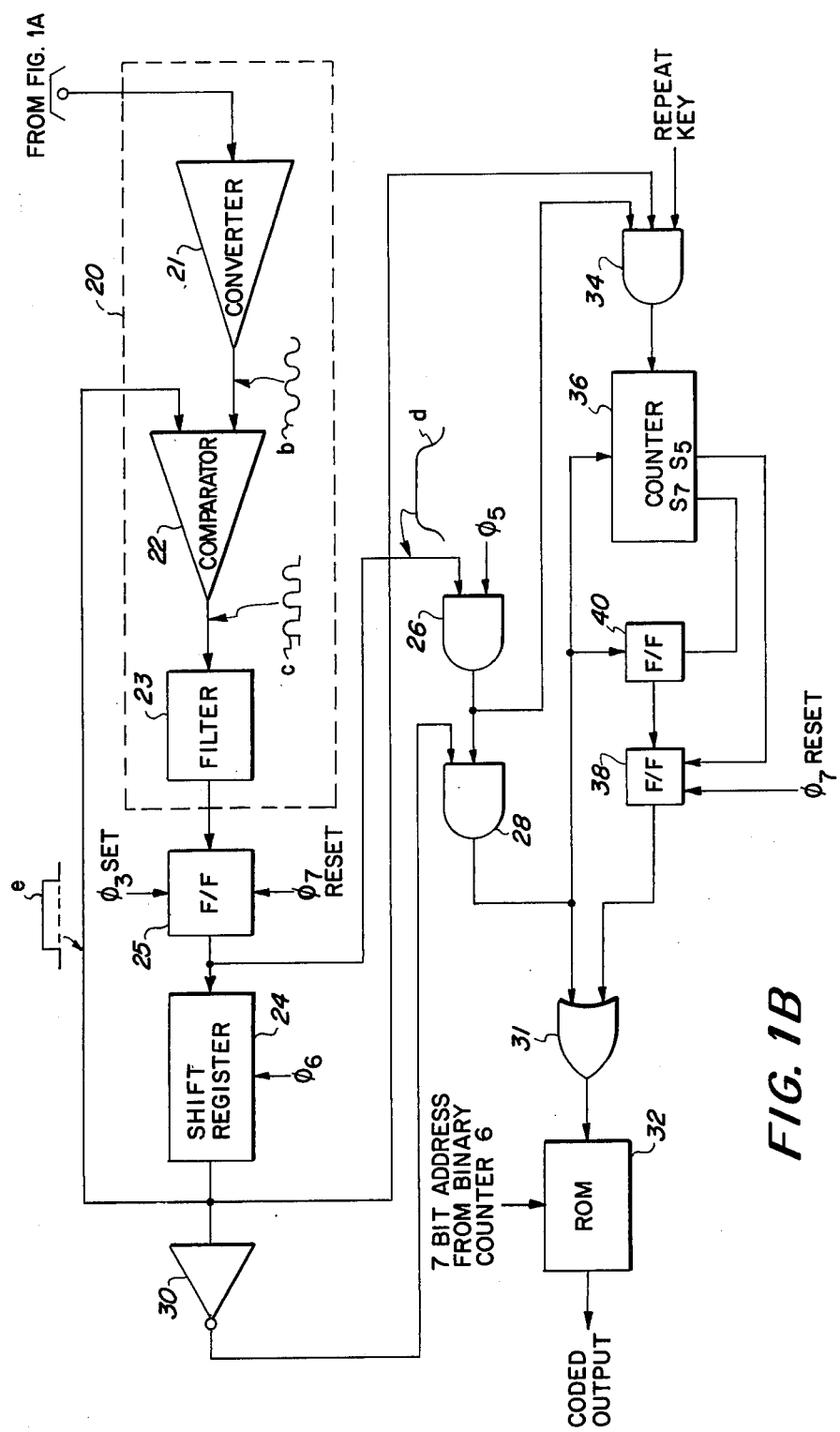

Referring now to FIGS. 1a, 1b, a polyphase clock generator 2 is supplied a high frequency signal from a free running master oscillator 4 and is supplied with a DC voltage $V_D$ to produce a plurality of phase output signals indicated as $\phi_1$, $\phi_2$, $\phi_3$, $\phi_4$, $\phi_5$, $\phi_6$ and $\phi_7$. The $\phi_1$ output signal of clock generator 2 is supplied to a 7 bit binary counter 6, with the lease significant 3 bits of the output of binary counter 6 being supplied through large value resistors 8 to a 1 of 8 decoder 10 which is incremented in accordance with the binary count supplied thereto to provide an active high on one of its output lines and an active low on the remaining seven of its output lines. The $V_{DD}$ voltage supplied to the decoder 10 is modulated with a small amplitude modulated signal provided by generator 12. The four significant bits of the output of binary counter 6 are supplied to a 1 of 16 decoder 14 which is incremented in accordance with the binary count supplied thereto to provide an active high on one of its output lines and an active low on the remaining 15 of its output lines. Each of the output lines of decoder 10 is supplied through a small value resistor 16 to one of the drive lines of a capacitive switch matrix 18 and each of the output lines of decoder 14 is supplied through a small value resistor 19 to one of the sense lines of capacitive switch matrix 18 to enable decoding of a maximum of 128 possible positions of the capacitive switch matrix 18.

Figure 2:
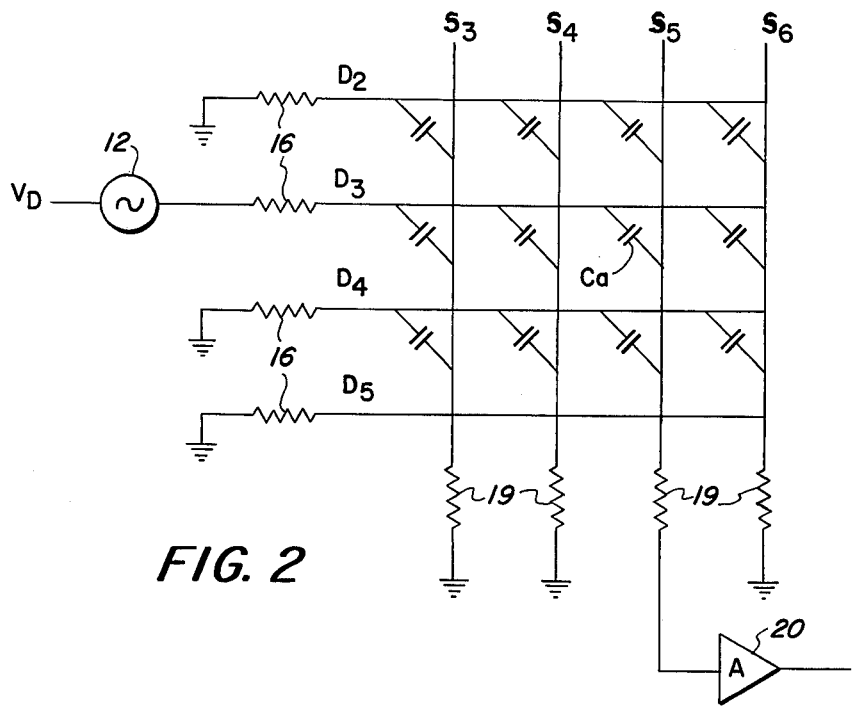
FIG. 2 shows schematically the equivalent circuit of a portion of the system of FIGS. 1a, 1b.

FIG. 2 shows schematically the equivalent circuit of the drive lines D and the sense lines S of a portion of the matrix 18. The crossover points of the drive and sense lines define capacitors which are shown representatively. It should be noted that the drive and sense lines are in actuality connected to metallic plates which in fact define the capacitors. Only one drive line, such as drive line $D_3$ shown in FIG. 2 will receive at any instant the signal from generator 12 and only one sense line such as sense line $S_5$ will be coupled at any instant to a sense amplifier 20. The other drive lines, such as $D_2$, $D_4$ and $D_5$, will be coupled to ground via resistors 16 and the other sense lines, such as $S_3$, $S_4$ and $S_6$ will be coupled to ground via resistors 19. The binary counter 6 and the decoders 10 and 14 operate such that each of the crossover points of the matrix 18 is sequentially or periodically addressed or sensed in the manner that crossover point $C_A$ is sensed in FIG. 2. Isolation of the 3 logic inputs to the counter is accomplished by large value resistors 8 in series with the logic lines.

A plate of each of the capacitors defining the crossover points of the matrix 18 is movable and is connected to a mechanical key to provide, upon depression of a key, for a change in the plate spacing of the capacitor associated with the depressed key. The spacing of a pair of plates at a matrix crossover point can be such that the capacity is approximately 2 pf when the key associated with that crossover point is not depressed and approximately 35 pf or more when the key associated with that crossover poiint is depressed. The frequency of oscillator 4 is chosen such that the minimum capacitive reactance X of a closed switch is about 10 times the value of resistors 16 and 19. When a sensed crossover point, such as crossover point $C_A$ of FIG., 2 has a minimum capacitive reactance, that is, the key associated with that crossover point is depressed, a minimum impedence path is closed from generator 12 to sense amplifier 20. If the capacitive reactance of the sensed crossover point is low, a low impedence path is closed. Sense amplifier 20 senses the amplitude of the signal supplied thereto and determines if the crossover point being sensed has been switched (key depressed), and produces an output of high value when the crossover point being sensed has been switched.

As shown in FIGS. 1a, 1b, sense amplifier 20 may include, for example, a current-to-voltage converter 21, a comparator 22 including a differential amplifier, and a filter 23. When a sensed matrix crossover point is closed, that is, has minimum capacitive reactance, the waveform a is supplied to the input of converter 21. Waveform a can have a dc level of $V_{DD}$ volts. Waveform a is processed by current-to-voltage converter 21 to provide at one input of comparator 22 a waveform b which may have a peak to peak amplitude of 2 volts. The output of comparator 2 has the form of waveform c which can have a maximum value of about 10 volts. Filter 23 integrates waveform c to produce waveform d which is supplied via a flip--flop 25 to the input of a shift register 24 which has as many stages as the number of crossover points of matrix 18.

Flip-flop 25 receives the $\phi_3$ output signal of clock generator 2 for setting thereof and the $\phi_7$ output signal of clock generator 2 for resetting thereof. Shift register 24 receives and is clocked by the $\phi_6$ output of clock generator 2 and has its output signal fed back to a second input of the comparator 22 of sense amplifier 20. Since the number of stages of the shift register 24 is equal to the number of crossover points of the matrix 18, the output of the shift register prior to $\phi_6$ is the status of the key or matrix crossover point presently being sensed at the time of the previous scan of that matrix crossover point. If the key or matrix crossover point presently being sensed was not closed during the previous scan cycle, a low valued feedback signal is supplied to the second input of comparator 22 of sense amplifier 20 and the sensitivity of amplifier 20 is not changed. If the key or matrix crossover point presently being sensed was closed during the last scan cycle, a high valued feedback signal (waveform e) is supplied to the second input of comparator 22 of sense amplifier 20 and the sensitivity of the sense amplifier 20 is increased for the crossover point presently being sensed, that is, the sense amplifier 20 will provide an output signal indicating matrix crossover point closure at an input signal amplitude level which is less than the input signal amplitude level that was required to produce an output signal indicative of matrix crossover point closure when the matrix crossover point being sensed was not closed during the previous scan cycle. In other words, when the sensitivity of amplifier 20 is increased, waveform a can have a smaller dc level and still cause amplifier 20 to produce waveform d. Changing the signal discrimination level of amplifier 20 by the state of the previous scan of a matrix crossover point is the equivalent of mechanical hysteresis of the key.

Changing of the sensitivity of the sense amplifier 20 in accordance with the status during the previous scan cycle of the matrix point being sensed is desirable because it eliminates eratic switch closure detection. If a particular key was detected as being closed during the previous scan cycle and is still closed during the present scan cycle, it is probable that the key operator intended that the key be closed and that one key code should be generated. However, should the key operator inadvertently relax the pressure on the key desired to be closed and if such relaxed pressure increases the capacitive reactance of the sensed crossover point such that the level of the input to the amplifier 20 at its normal sensitivity level is too low for amplifier 20 to generate a high valued output, this inadvertence on the part of the key operator would lead to a key closure being detected during inconsecutive scan cycles with the resulting generation of some undesirable key codes. By increasing the sensitivity of sense amplifier 20 in accordance with the status of the crossover point being sensed during the previous scan cycle, that is, by lowering the value of the input signal voltage supplied to the sense amplifier that is needed to indicate key closure, such inadvertent action on the part of the key operator does not prevent key closure detection during subsequent scan cycles.

Returning to FIGS. 1a, 1b, in addition to being supplied to the shift register 24, the output of flip-flop 25 is supplied to an AND gate 26 which also receives the $\phi_5$ output signal of clock generator 2. The output of gate 26 is supplied to an AND gate 28 which also receives the output of shift register 24 via inverter 30. The output of gate 28 is supplied through an OR gate 31 to a ROM 32 or other encoding device which also receives the 7 bit address from counter 6 to convert the scanning code to a code representative of the particular key closed.

Figure 3:
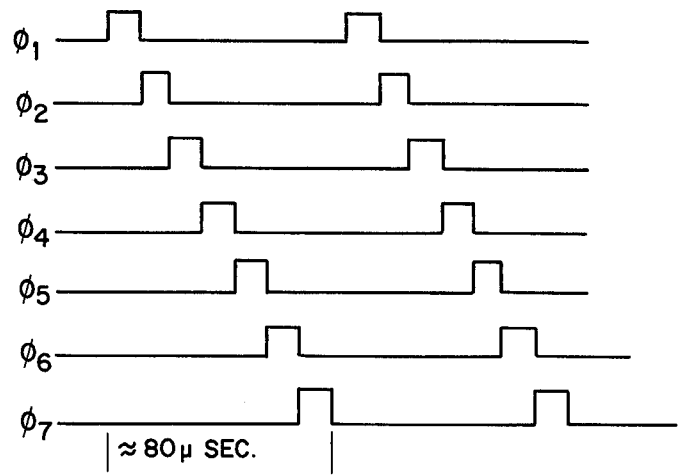
FIG. 3 represents a timing diagram for the system of FIGS. 1a, 1b.

FIG. 3 depicts the timing diagram of the encoding system. The $\phi_1$ output signal is supplied to counter 6, the $\phi_3$ and $\phi_7$ output signals are supplied to flip-flop 25 to clock and reset flip-flop 25, respectively, the $\phi_5$ output signal is supplied to AND gate 26 and the $\phi_6$ output signal is supplied to shift register 24. At $\phi_1$, the binary counter is incremented such that decoders 10 and 14 sense the next matrix crossover point in the sensing sequence. If the sensed crossover point is closed, a low impedance path is closed and the sense amplifier 20 provides a high valued output whiich is supplied to flip-flop 25 which is rendered conductive at $\phi_3$ such that the output signal of sense amplifier 20 is supplied to gate 26 and shift register 24. At $\phi_5$ the gate 26 has its other input pulsed such that, if the output of sense amplifier 20 is high, the gate 26 is rendered conductive at $\phi_5$ and the output signal of sense amplifier 20 is supplied as one input to gate 28. Since the shift register 24 has the same number of stages as the matrix 18, the output of shift register 24 after $\phi_6$ will represent the status of the matrix crossover point to be scanned next, that is, when the next $\phi_1$ pulse is supplied to counter 6. Thus, the output of the shift register 24 represents the status of the matrix crossover point presently being sensed until $\phi_6$. If the matrix crossover point being sensed was not closed the last scan cycle, the output of shift register 24 will be low. Inversion of the low output of shift register 24 is provided such that gate 28 will conduct when the output of sense amplifier 20 is high for the crossover point being sensed provided that the crossover point being sensed was not closed (did not produce a high output) during the previous scan cycle. Thus, if the matrix crossover point being sensed was closed the last scan cycle, the output of shift register 24 will be high to $\phi_6$ and inversion of that high output by inverter 30 will provide a low input to gate 28 to keep it open. Thus, undesirable multiple encoding is prevented. At $\phi_7$, flip-flop 25 is reset and the scan system is set for scanning the next matrix crossover point of the scan sequence.

As described, the encoding system pemits one output per key stroke. However, when the closed key is a repeat key, such as an underline key, multiple outputs can be provided. Referring again to FIGS. 1a, 1b, an AND gate 34 is supplied the output of gate 26, the output of shift register 24, and a signal indicating that the sensed key is a repeat key. The output of gate 34 is supplied to the count terminal of a counter 36 which has its reset terminal coupled to the output of gate 28. One of the output stages, for example, stage 5, of counter 36 is connected to a flip-flop 38 which provides a repeat function and another, higher order stage of the counter 36, for example, stage 7, is connected to a flip-flop 40 which provides a delay or pause function. Flip-flop 40 receives the output of gate 28 and flip-flop 38 is coupled to flip-flop 40 and is reset at $\phi_7$. The output of flip-flop 38 is coupled to OR gate 31.

In operation, when a repeat key is closed and the repeat key was closed the last scan cycle, the gate 34 is closed and the counter 36 is incremented each time a specific repeat key is sensed. When the counter 36 reaches the 5th stage, that is, after 5 scan cycles, a high valued output signal is supplied to flip-flop 38 to set the same. However, at $\phi_7$, flip-flop 38 is reset with no high value output signal being supplied gate 31. If the repeat key remains closed, the counter 36 will continue to increment and at stage 7 will set the flip-flop 40. As the counter continues to increment due to the repeat key remaining closed, the counter recycles and at stage 5 will pulse flip-flop 38. Since flip-flop 40 was set previously as stage 7 and setting of flip-flop 40 primed flip-flop 38, flip-flop 38 will be set at stage 5 and provide until it is reset at $\phi_7$ a high valued output signal which is gated via OR gate 31 to ROM 32 for coding. Thus, a pause is built into the repeat key function to provide assurance that a repeat key function was actually intended by the keyboard operator. The repeat key function is stopped when the repeat key is released or when a new key is closed. In the latter case, the high output at gate 28 resets counter 36 and flip-flop 40.

Relating to specific circuit components, master oscillator 4 can be formed by two sections of a triple NAND gate in conjunction with two resistors and a capacitor as manufactured by Motorola Corporation as MC 14023 which forms a free running square wave oscillator operating at about 100 kHz, clock generator 2 can be Motorola Corporation MC 14022, counter 6 can be Motorola Corporation MC 14520, 1 of 8 decoder 10 can be a CMOS decoder as Motorola Corporation Mc 14028, decoder 14 can be two 1 of 8 decoders such as Motorola Corporation MC 14028, voltage $V_{DD}$ can be 10 volts, oscillator 12 can produce a small amplitude sine wave with a frequency of approximately 4 MHz, shift register 24 can be Motorola Corporation MC 14562, and counter 36 can be Motorola Corporation MC 14024. With the components specified, the counter 6 would increment approximately each 80 microseconds, that is, $\phi_1$ would supply a pulse to counter 6 approximately every 80 microseconds. Resistors 16 and 19 can have a value of about 100 ohms and resistors 8 can have a value of about 100K ohms.

What is claimed is:

1. A switching device encoding system comprising:
   a voltage source,
   an array of switching devices, each of which has a low impedance in a closed state and a high impedance in an open state,
   signal amplitude sensing means,
   first means coupled to said array, to said voltage source and to said signal amplitude sensing means for continuously, cyclically addressing in a predetermined sequence each switching device of said array such that each of said switching devices of said array couples said voltage source to said signal amplitude sensing means, whereby a signal of one amplitude is supplied to said signal amplitude sensing means when a closed switching device is coupled to said voltage source and said signal amplitude sensing means and a signal of a different amplitude is supplied to said signal amplitude sensing means when an open switching device is coupled to said voltage source and said signal amplitude sensing means,
   said signal amplitude sensing means providing an output signal of a high value when the input signal supplied thereto is above a certain amplitude,
   storage means coupled to said signal amplitude sensing means for storing the state of each of said switching devices during the previous scan cycle,
   feedback means coupled between said storage means and said signal amplitude sensing means for increasing the sensitivity of said signal amplitude sensing means if a switching device currently being sensed was in a closed state the previous scan cycle, and
   logic means coupled to the output of said storage means and to the output of said signal amplitude sensing means, said logic means providing an output signal only when the output of said storage means and the output of said signal amplitude sensing means are different.

* * * * *